(12) United States Patent
Khoshnegar Shahrestani et al.

(10) Patent No.: US 12,498,643 B2
(45) Date of Patent: Dec. 16, 2025

(54) FABRICATION OF MICROSCALE STRUCTURES

(71) Applicant: Authentix, Inc., Addison, TX (US)

(72) Inventors: Milad Khoshnegar Shahrestani, Coquitlam (CA); Ripon Dey, Maple Ridge (CA)

(73) Assignee: Authentix, Inc., Addison, TX (US)

( * ) Notice: Subject to any disclaimer, the term of this patent is extended or adjusted under 35 U.S.C. 154(b) by 105 days.

(21) Appl. No.: 18/412,449

(22) Filed: Jan. 12, 2024

(65) Prior Publication Data

US 2024/0241450 A1 Jul. 18, 2024

Related U.S. Application Data

(60) Provisional application No. 63/479,722, filed on Jan. 12, 2023.

(51) Int. Cl.
*G03F 7/00* (2006.01)
*G03F 7/30* (2006.01)
*H01J 37/32* (2006.01)

(52) U.S. Cl.
CPC ............ *G03F 7/704* (2013.01); *G03F 7/0005* (2013.01); *G03F 7/30* (2013.01); *H01J 37/32082* (2013.01); *H01J 37/32449* (2013.01); *H01J 2237/3341* (2013.01)

(58) Field of Classification Search
CPC .......... G03F 7/704; G03F 7/0005; G03F 7/30; G03F 7/40; H01J 37/32082; H01J 37/32449; H01J 2237/3341
See application file for complete search history.

(56) References Cited

U.S. PATENT DOCUMENTS

| | | | |
|---|---|---|---|
| 6,358,670 B1 * | 3/2002 | Wong | G03F 7/40 430/296 |
| 9,117,769 B2 * | 8/2015 | Koiwa | H01L 21/31122 |
| 9,400,432 B2 * | 7/2016 | Heussler | G02B 5/18 |
| 9,773,679 B2 * | 9/2017 | Gupta | H01L 21/3065 |
| 9,791,779 B2 * | 10/2017 | Huli | H01L 21/0271 |

\* cited by examiner

*Primary Examiner* — Hung V Nguyen
(74) *Attorney, Agent, or Firm* — Conley Rose, P.C.; Rodney B. Carroll (57) ABSTRACT

A method for patterning a substrate involves depositing a layer of resist material on a surface of the substrate, lithographically patterning (electron beam exposing and then developing) the layer of the resist material to form a patterned resist layer having a pattern multi-faceted microscale structures with a depth profile that varies over an area of the layer of resist material, and using the patterned resist layer in an etching step to transfer the pattern of multi-faceted microscale structures from the patterned resist layer to the substrate.

20 Claims, 10 Drawing Sheets

FABRICATION OF MICROSCALE STRUCTURES

CROSS REFERENCE TO RELATED APPLICATION

This application claims the benefit under 35 U.S.C. § 119(e) from U.S. Provisional Application No. 63/479,722, entitled "Fabrication Of Microscale Structures," filed on Jan. 12, 2023. The entirety of the disclosure of the foregoing document is incorporated herein by reference.

TECHNICAL FIELD

The present disclosure is in the field of metamaterials. More particularly, the disclosure relates to design and fabrication of metamaterials including multi-faceted microstructures.

BACKGROUND INFORMATION

Design and fabrication of multi-faceted microstructures provides a platform for realizing color display and beam rendering in optically variable anti-counterfeiting features. The perceived optical image may be constructed of nanostructures overlaid on facets of patterned microstructures to allow for changing the displayed optical image over a wide viewing zone. The viewing zone of the microstructure is related to the microstructure height and the slope of the facets.

Producing multi-faceted microstructures with smooth surfaces and tunable height is challenging. Roughness and irregularity of the microstructure facets may impact the beam wavefront reflected from them; thus, a controlled method to form the microstructures with arbitrary facet shapes and angles is desirable. Moreover, excessive roughness of the microstructure facets impedes the formation of nanostructures during the manufacturing process. In addition, most photolithography techniques provide low resolution patterning which does not produce accurately-shaped microstructures when combined with isotropic etching techniques.

The standard Bosch process (see, e.g., Kovacs (1998) *Proc. IEEE*, 86, 8:1536-1551, which is incorporated herein) generally used for deep etching, does not support smooth sidewalls as it is a periodic process leading to the formation of ripple structures in the etch profile.

Thus, what is needed are improved methods and systems to control the shape of multi-faceted microstructures for optically variable anti-counterfeiting features.

SUMMARY

It has been discovered that controlling the beam parameters of the electron beam in grayscale lithography applied herein provides a method to control the shape of each microstructure independently. Exposing the patterned resist layer and substrate to thermal reflow reduces the surface roughness of the etched resist layer such that the patterned substrate has higher anisotropy. The non-switching etch process combined with the controlled beam lithography enables fabrication of highly anisotropic (e.g., anisotropy of greater than about 1) patterned microstructures.

This discovery has been exploited to develop the present disclosure, which, in part, is directed to a selective anisotropic deep etch method combined with a grayscale electron-beam lithography which can be used to form microstructures at increased resolutions and reduced surface roughness compared to current methods. The microstructures can have a variety of different shapes, including irregular shapes In one aspect, the disclosure provides a method for patterning a substrate, including: depositing a layer of resist material on a surface of the substrate, the substrate including a substrate material; lithographically patterning the layer of the resist material to provide a patterned resist layer having a pattern with a depth profile that varies over an area of the layer of resist material, wherein the lithographic patterning includes exposing the layer of the resist material to an electron beam while varying an energy of the electron beam over the area in a pattern that corresponds to the depth profile to provide an exposed resist layer and developing the exposed resist layer to selectively remove resist material from the exposed resist layer for provide the patterned resist layer; and etching the patterned resist layer and the substrate by exposing the patterned resist layer and the substrate to a plasma under conditions sufficient to transfer the pattern of the patterned resist layer to the substrate by removing substrate material from the substrate to form a patterned substrate having a depth profile corresponding to the depth profile of the patterned resist layer.

Examples may include one or more of the following features. The depth profile of the patterned substrate can have a maximum dimension that can be greater than the maximum dimension of the depth profile of the patterned resist layer. The maximum dimension of the depth profile of the patterned substrate can be in a range from about 1 micron to about 20 microns. The pattern can be a periodic pattern. The depth profile of the patterned substrate can be scaled to the depth profile of the patterned resist layer by a selectivity value. The selectivity value can be greater than about 1. Lithographically patterning the layer of resist material can include applying greyscale electron beam lithography, laser direct-write lithography, or greyscale photolithography. The greyscale electron beam lithography can include scanning an electron beam over a plurality of steps, each step having a step size, and the electron beam size having greatest dimension at least 5 times greater than the beam step size during rastering. Developing the resist material can include exposing the resist material to a chemical development material. The resist material can be a positive resist material.

The method can further include, between lithographically patterning and etching, exposing the patterned resist to a thermal reflow process comprising elevating a temperature of the substrate and the patterned resist material above a glass transition temperature of the patterned resist material and below a glass transition temperature of the substrate. The temperature of the substrate and the patterned resist material can be in a range from about 120° C. to about 140° C. A roughness of the patterned resist layer, following the thermal reflow process, can be less than an RMS roughness of about 100 nanometers. Exposing the patterned resist layer and the substrate to a plasma can include providing a first gas and a second gas to a process chamber at a first flow rate and a second flow rate, respectively, and applying an RF power in the process chamber to generate the plasma. The first gas or the second gas comprise molecular oxygen, sulfur hexafluoride, or octafluorocyclobutane. The first flow rate and the second flow rate are in a range from about 60 sccm to about 90 sccm. The RF power can be in a range from about 60 Watts to about 160 Watts. The method can further include chilling, during the exposing the patterned resist layer and the substrate to a plasma, the patterned resist layer and the substrate below a temperature threshold. The temperature threshold can be in a range from about −15° C. to about 15° C.

The method can further include pressurizing, during the exposing the patterned resist layer and the substrate to a plasma, the process chamber to a pressure threshold in a range from about 90 millitorr and about 130 millitorr.

In another aspect, disclosed herein is a metamaterial device having a plurality of faceted microstructures fabricated using the method described supra.

Further details and embodiments and methods and techniques are described in the detailed description below. This summary does not purport to define the invention. The invention is defined by the claims.

DESCRIPTION OF THE DRAWINGS

The foregoing and other objects of the present disclosure, the various features thereof, as well as the disclosure itself may be more fully understood from the following description, when read together with the accompanying drawings in which.

In the figures, like references indicate like elements.

DETAILED DESCRIPTION

The disclosures of these patents, patent applications, and publications in their entireties are hereby incorporated by reference into this application in order to more fully describe the state of the art as known to those skilled therein as of the date of the invention described and claimed herein. The instant disclosure will govern in the instance that there is any inconsistency between the patents, patent applications, and publications and this disclosure. Unless defined otherwise, all technical and scientific terms used herein have the same meaning as commonly understood by one of ordinary skill in the art to which this disclosure belongs. The initial definition provided for a group or term herein applies to that group or term throughout the present specification individually or as part of another group, unless otherwise indicated.

As used herein, the articles "a" and "an" refer to one or to more than one (i.e., to at least one) of the grammatical object of the article. By way of example, "an element" means one element or more than one element. Furthermore, use of the term "including" as well as other forms, such as "include," "includes," and "included," is not limiting.

As used herein, the term "about" will be understood by persons of ordinary skill in the art and will vary to some extent on the context in which it is used. As used herein when referring to a measurable value such as an amount, a temporal duration, and the like, the term "about" is meant to encompass variations of ±20% or ±10%, including ±5%, ±1%, and ±0.1% from the specified value, as such variations are appropriate to perform the disclosed methods. For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components have not been described in detail to avoid obscuring the examples described.

This specification describes a dry-etching process including grey-scale electron beam lithography (EBL) and non-switching, highly selective, anisotropic etching which controllably produces deep, faceted microstructures. This technique enables manufacturing of shaped microstructures at wafer scale. The shaped microstructures can be used for optically variable devices or display devices. The anisotropic etch process transfers an EBL patterned resist onto the silicon and controls the microsurface facet angles by facilitating a wide range of the silicon-to-resist etch selectivity. The process achieves well-defined facet profiles with low surface roughness.

The dry-etching process involves tuning the etch selectivity within a certain range (e.g., but not limited to, from about 9 to about 24, such as from about 11 to about 24) while maintaining the anisotropic etch profile. The etch selectivity is tuned by modifying etch parameters such as gas flow, chamber pressure, platen power, and chiller temperature in the etch system. The dry-etch process can produce highly anisotropic faceted three dimensional microstructures on a substrate using grey-scale EBL.

Figure 1A:
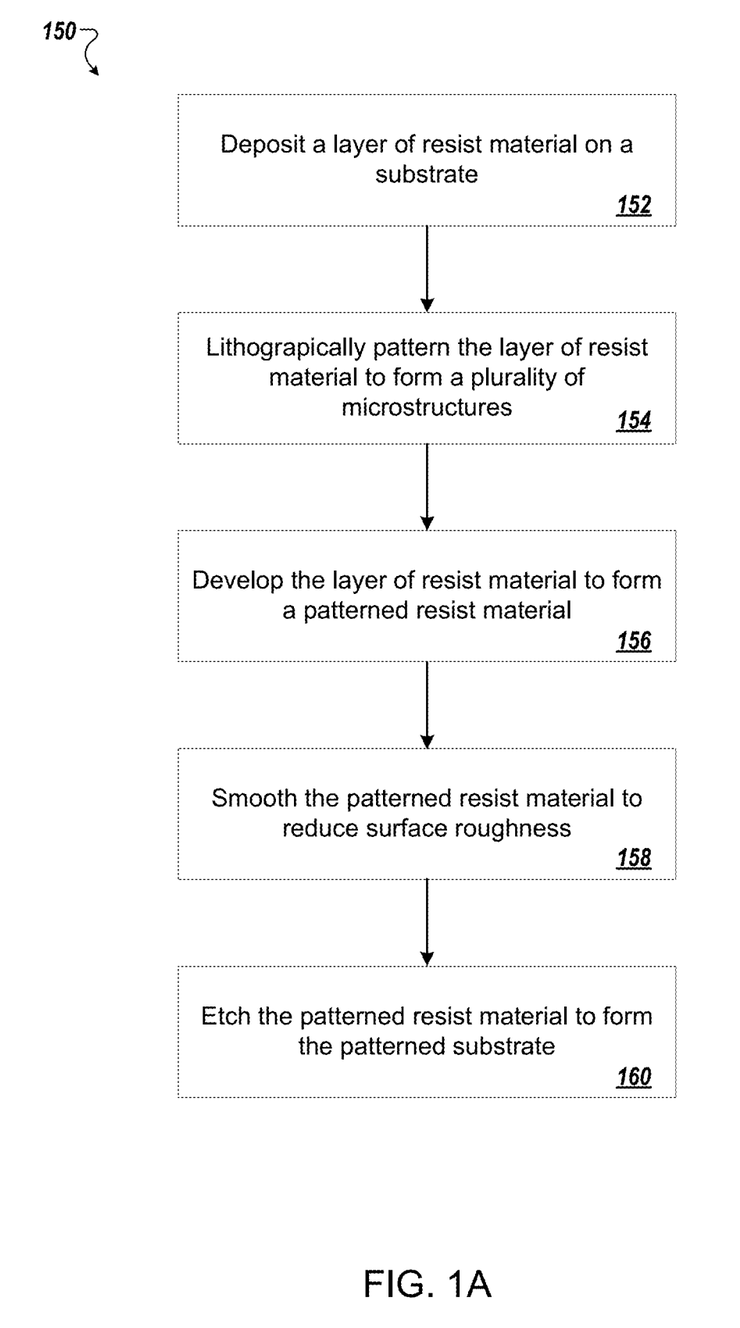
FIG. 1A is a diagrammatic representation of a method for fabrication of microsurface structures in accordance with the disclosure.
Figure 1B:
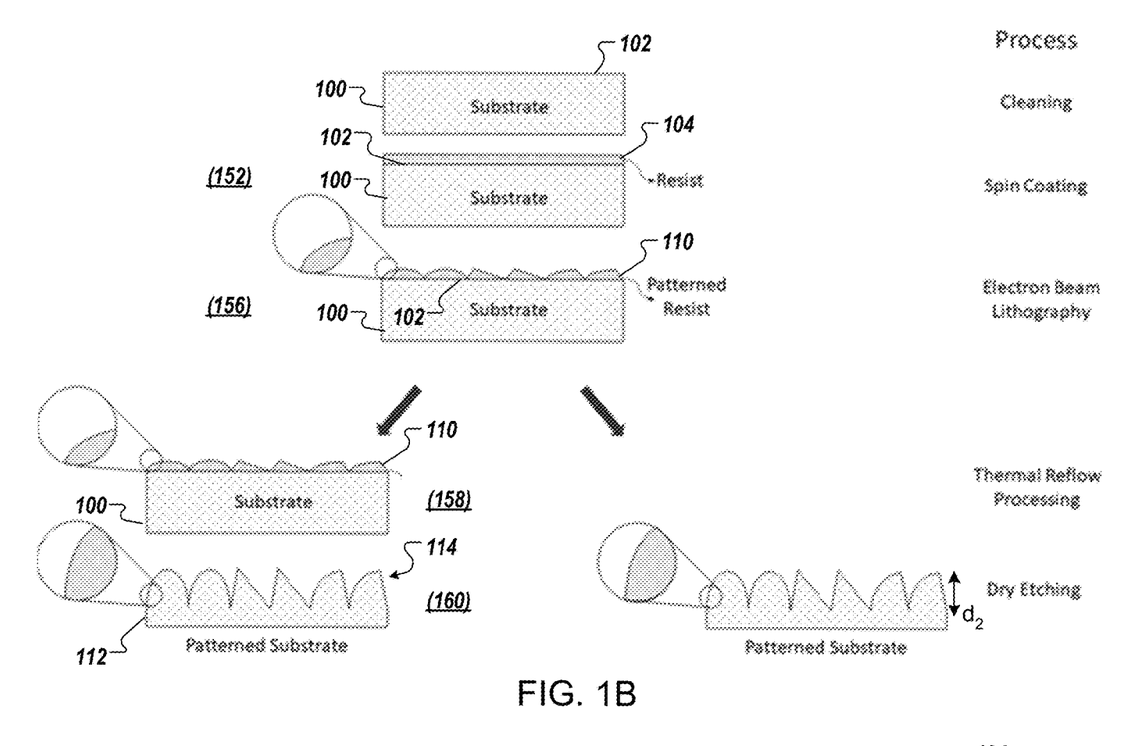
FIG. 1B is a schematic representation of the method for fabrication of a substrate having microsurface structures in accordance with the disclosure.

Steps in an example process 150 of fabricating faceted microstructures on a substrate 100 including depositing a layer of electron beam resist material on a substrate 100 are shown in a flowchart diagram of FIG. 1A. Schematic depictions of structures formed during the process 150 are shown in FIG. 1B. In the following description, reference will be made to the steps of the process 150 in FIG. 1A and the schematic depictions of FIG. 1B.

A resist material layer 104 is deposited (152) on the upper surface 102 of the substrate 100. A nonlimiting example of the substrate 100 is a crystalline silicon (Si) wafer. The substrate is not a wafer of integrated circuits and does not include circuitry. Rather, the substrate is used for pattern transfer purposes. The substrate includes a substantially planar upper surface 102. The resist material layer 104 functions as a soft mask material for the subsequent dry etching process. The material for the layer 104 is selected based on the process used to etch the layer 104 in subsequent steps and is an electron beam resist material, such as a positive beam resist material (e.g., ZEP520A), suitable for use with the selected substrate 100 and to achieve a desired selectivity value (e.g., selectivity>1). In one nonlimiting example, ZEP520 is used as a positive beam resist material since ZEP520 has both higher sensitivity and etch resistance compared to other positive- or negative-resist material which facilitates the fabrication of the etched micro-structures in the resist layer 104.

The layer 104 is deposited to a depth that is greater than the maximum height of the microstructures to be patterned into the layer 104, which is greater than a depth profile corresponding with the microstructures to be patterned. The material layer 104 is deposited by a resist material deposition method known to those in the field, which includes, but is not limited to, spin coating, or spray coating.

The resist material layer 104 is lithographically patterned (154) to form a plurality of microstructures. In a nonlimiting example, the resist material layer 104 is patterned using greyscale EBL which produces patterned depth profiles (surface topographies), in exposed and developed resist materials by controlling the incident energy of the electron beam. Exposing the resist material layer 104 to the electron beam changes the solubility of exposed resist material layer 104, thereby enabling selective removal of the exposed portions of the resist material. By varying the energy of the electron beam, the depth of resist material that is exposed is varied to pattern of exposed resist material. Due to the changes in solubility of the exposed resist material as compared to the deeper unexposed resist material, selective removal of the exposed resist material in a subsequent chemical development step results in differences in depth of the resist remaining on the substrate. In this way, microstructures of the resist material layer 104 are formed on the substrate. Alternatively, the microstructures are lithographically patterned using direct-write laser etching, or greyscale photolithography. The resist material and any necessary mask is updated based on the selected lithography technique.

When exposing an arbitrary division during EBL, the impact of electron forward- and backscattering affects neighboring divisions. A proximity effect correction mechanism accounting for the electron forward- and backscattering effects is implemented to deliver the correct amount of total electron energy to each division.

In general and without wishing to be bound by theory, the proximity effect correction mechanism accounts for stray electrons which can contribute to the targeted electron beam energy delivered to an exposure point, via either forward or backward scattering mechanisms. Forward scattering is the scattering of the electrons inside the resist material which results in widening of the effective beam radius, whereas the backscattering effect occurs when the electrons hit the hard substrate underneath the resist and are scattered back into the resist medium with a different angle than the ideally normal/original angle. Both scattering effects contribute to delivering excessive electrons (e.g., excess energy) to the targeted areas in the exposed resist and cause broadening of the feature or irregularities in the shapes produced in the beam resist material.

Proximity correction is implemented by calculating the forward and backward scattered electrons depending on the shape and density of the exposure points, the beam energy, the beam size, the resist material, and the substrate material, and by modulating the corrected electron energy to minimize excessive exposure. In one nonlimiting example, BEAMER software (GenISys, DE) is used to compute a modulated dose spectrum for the back-scattering dose level correction. Dose levels are automatically generated by defining a dose accuracy. Minimum fracture size control and pre-fracturing allows optimization of the number of shapes compared to the accuracy of each shape.

Figure 1C:
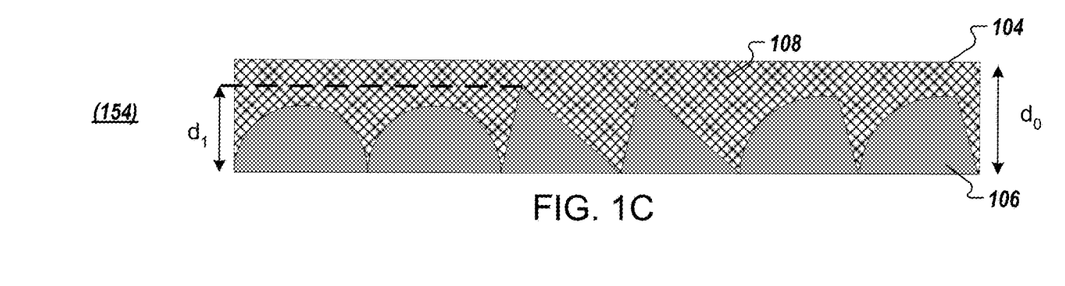
FIG. 1C is a schematic representation of microsurface structures in accordance with the disclosure.

An exemplary two-dimensional cross section of a microstructure depth profile 106 to be lithographically patterned into the resist material layer 104 is shown in FIG. 1C. The resist material layer 104 is exposed using greyscale EBL to produce exposed material 108. In some nonlimiting examples, the microstructure depth profile 106 is approximated with a piecewise linear approximation as a part of implementing the grayscale EBL. In such examples, the surface area of each microstructure is discretized into an integer number of divisions with a range of heights.

During EBL, each division of each microstructure of the microstructure depth profile 106 is scanned with the electron beam. The energy level of the electron beam is set with respect to the desired exposed resist height within each division and a resist contrast curve. The contrast curve of the resist material is defined as the ratio of the unexposed resist film thickness, see for example thickness $d_1$, to the original resist material layer 104 thickness, $d_0$, after development as a function of the EBL exposure dose.

The method includes developing (156) the resist material layer 104 to form a patterned resist layer. The resist material layer 104 is chemically developed to remove the exposed material 108 and expose the patterned resist 110. The chemical development process includes exposing the resist material layer 104 to a chemical developer. The chemical developer is selected based on the resist material forming the resist material layer 104. In one nonlimiting example, the resist material layer 104 is ZEP520A (Zeon Corporation, Tokyo, JP).

The resist material layer 104 is exposed to the chemical developer for a time period sufficient to fully develop the exposed material 108. In some examples, this time period is in a range from about 1 second to about 2 minutes (e.g., about 3 seconds to about 90 seconds, or about 60 seconds). Developing the resist material layer 104 is performed in a batch process, e.g., a solution bath, a flow process, or both.

The resist material layer 104 is rinsed with a rinse agent to remove the developed exposed material 108 from the resist material layer 104 and expose the patterned resist 110. The rinse agent is selected based on the resist material and the chemical developer. Some examples of a rinse agent for use in this process include water, methyl isobutyl ketone, isopropyl alcohol, or a combination of rinse agents.

Following lithographic patterning, development, and rinsing, the surface of the patterned resist 110 includes some degree of surface roughness. As the depth profile 106 of the patterned resist 110 is amplified when transferred into the substrate 100 during subsequent dry etching, nano-scale roughness present on the substrate 100 is also transferred into the substrate 100. The substrate 100 and patterned resist 110 are exposed to thermal reflow processing (158) to reduce the surface roughness of the patterned resist 110. Thermal reflow is a mechanism which takes place as material is heated above the respective glass transition temperature and the material is displaced by surface tension.

The thermal reflow is temperature-controlled to reduce microscale deformation of the developed pattern and reduce nanoscale surface roughness. The substrate 100 and patterned resist 110 are exposed to a temperature above the glass transition temperature of the patterned resist 110 and below the glass transition temperature of the substrate 100 until the temperature of the patterned resist 110 is raised above the glass transition temperature. Nanoscale roughness (e.g., but not limited to, roughness having an RMS roughness of about 1 nm to about 10 nm) gradually decreases as the temperature increases, while the microstructures of the patterned resist 110 remain intact. In one nonlimiting example, the range of temperatures for 1.8 µm-thick ZEP520A is about 123° C. to about 127° C. (e.g., but not limited to, about 125° C.).

The thermal reflow is performed until a roughness threshold is exceeded, such that the nanoscale surface roughness of the patterned resist 110 is less than the roughness threshold. For example, the roughness threshold is less than 100 nm root mean square (RMS) roughness as measured by AFM. In some nonlimiting examples, the roughness threshold is less than about 100 nm RMS roughness (less than about 90 nm RMS roughness, less than about 75 nm RMS roughness, less than about 50 nm RMS roughness, less than about 40 nm RMS roughness, less than about 20 nm RMS roughness, less than about 10 nm RMS roughness, or less than about 5 nm RMS roughness).

In some nonlimiting examples, the roughness threshold is set according to the desired roughness of the patterned substrate. In such examples, the desired roughness of the patterned substrate is divided by the selectivity to determine the roughness threshold of the thermal reflow step. An exemplary useful roughness of the patterned substrate is up to 100 nm RMS roughness. In a nonlimiting example in which the selectivity is 20, the roughness threshold of the patterned resist 110 is determined to be up to 5 nm RMS roughness.

In general and without wishing to be bound by theory, the thermal reflow is performed for about 10 minutes to about 25 minutes (e.g., about 20 minutes) at about 125° C. to reduce the surface roughness of the patterned resist 110 is less than a roughness threshold of about 100 nm RMS roughness.

The substrate 100 and the patterned resist 110 are dry etched (160), such as deep reactive ion etching, to transfer the microstructure depth profile 106 of the patterned resist 110 into the substrate 100. In a nonlimiting example in which the microstructures on the patterned resist 110 are etched having a height, $h_{resist}$, from the upper surface 102, the corresponding microstructure height in the depth profile of the etched substrate 100 are scaled by (selectivity×$h_{resist}$). The dry etching process may remove all the resist material, and may leave the underlying substrate etched with deeper microstructures than were present in the patterned resist. The depth profile of the patterned resist is transferred into the substrate, but the heights of the corresponding microstructures in the substrate may be proportionally larger than the heights of the corresponding microstructures in the patterned resist.

The angle of the individual facets changes nonlinearly with selectivity. Without wishing to be bound by theory, a facet having an angle with respect to the normal vector of the upper surface 102 of $a_1$ produces a facet in the patterned substrate 114 of $a_2$ according to tan $(a_2)$=selectivity×tan $(a_1)$.

Figure 2A:
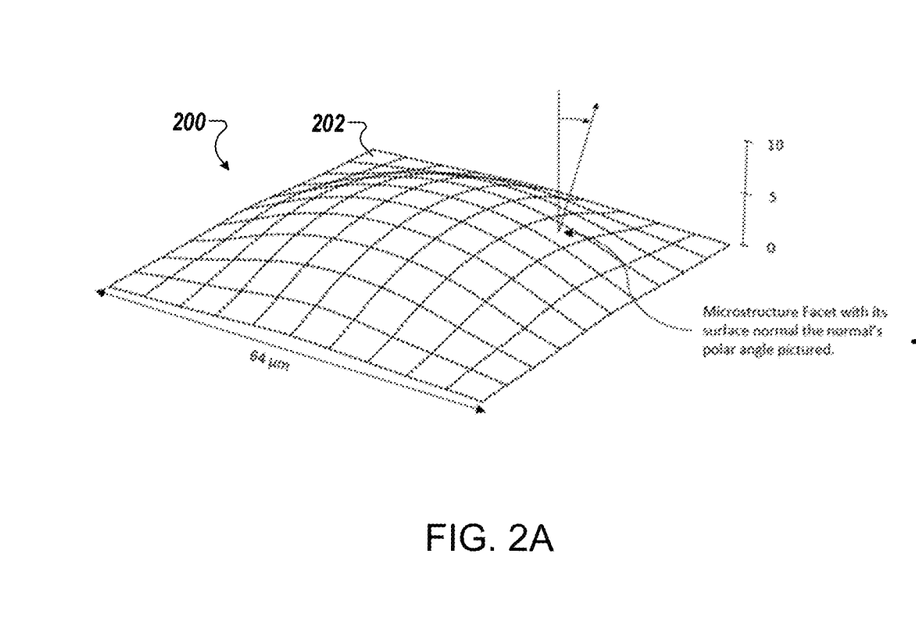
FIG. 2A is a schematic representation of facet divisions in accordance with the disclosure.

A portion of an example microstructure 200 is schematically illustrated in cross-section in FIG. 2A. Here, the surface profile of the microstructure 200 is divided into a hundred (10×10) equal divisions (e.g., but not limited to, squares), which are also referred to as facets 202. Two facets 204 and 206 are shown in cross-section in FIG. 2B. The normal vector of each facet can be determined using the corners of the facet, i.e., as the normal to the plane that intersects the corners. The facet 204 is sloped (i.e., non-parallel) with respect to the normal vector of the upper surface 102 and the slope is determined by the normal vector of the individual facet 204.

Figure 2B:
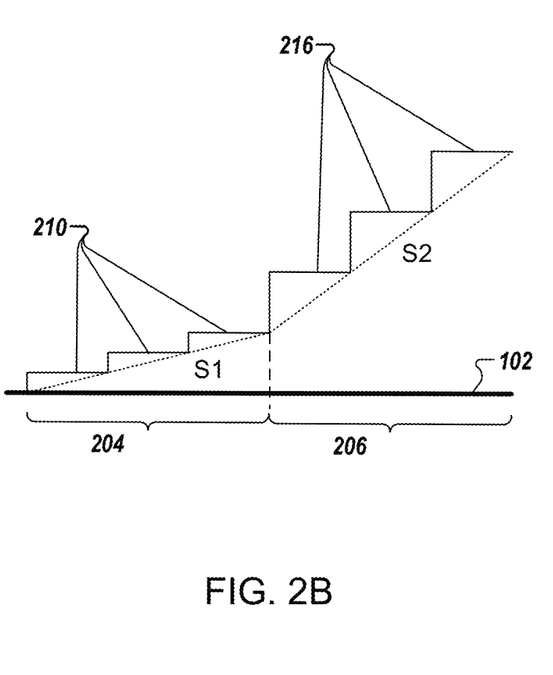
FIG. 2B is a schematic representation of facet division in accordance with the disclosure.

In turn, each facet is divided into a number of equal divisions (e.g., squares) having a surface parallel to the upper surface 102 (here the normal vector of each division of the facets is along the normal vector of the upper surface 102). Cross-sectionally, facet 204 is divided into three divisions 210 and facet 206 is divided into three divisions 216. The divisions 210 and 216 of the facets 204 and 206 are constructed at different heights depending on the slope of the individual facet 204 or 206. For example, divisions 210 define slope S1 while divisions 216 define slope S2 at a different angle with respect to the upper surface 102. By modulating the dose level of the EBL beam, each division of divisions 210 and 216 form at a different heights from the upper surface 102 and according to the slope of the facet (e.g., slope S1 for facet 204 or slope S2 for facet 206).

The exemplary microstructure 200 is 64 µm wide, 5.35 µm height, and 100 4×4 µm facets each having a surface normal having polar angles ranging up to 25° and azimuthal angles encompassing 360°. More generally, microstructures may have widths from 20 µm to 120 µm, with heights from 3.5 µm up to 15 µm, facet sizes from 1 µm to 12 µm, and each facets' surface normal can have polar angles that range up to 60°. For microstructures that are not radially symmetric, the azimuthal angle of the surface normal may also be limited to some smaller range. The height of the micro-dome depends on the selectivity we employ during the dry etching process.

Generally, the number of facets of a microstructure will depend on the dimensions of the microstructure and the dimensions of the facets. In another example, the microstructure is divided into X=256 facets, each 4 µm-wide. Each facet is then divided into Y=100 squares of 400 nm width. The 400 nm-wide squares are formed at different heights using dose modulation of the EBL beam.

Figure 3:
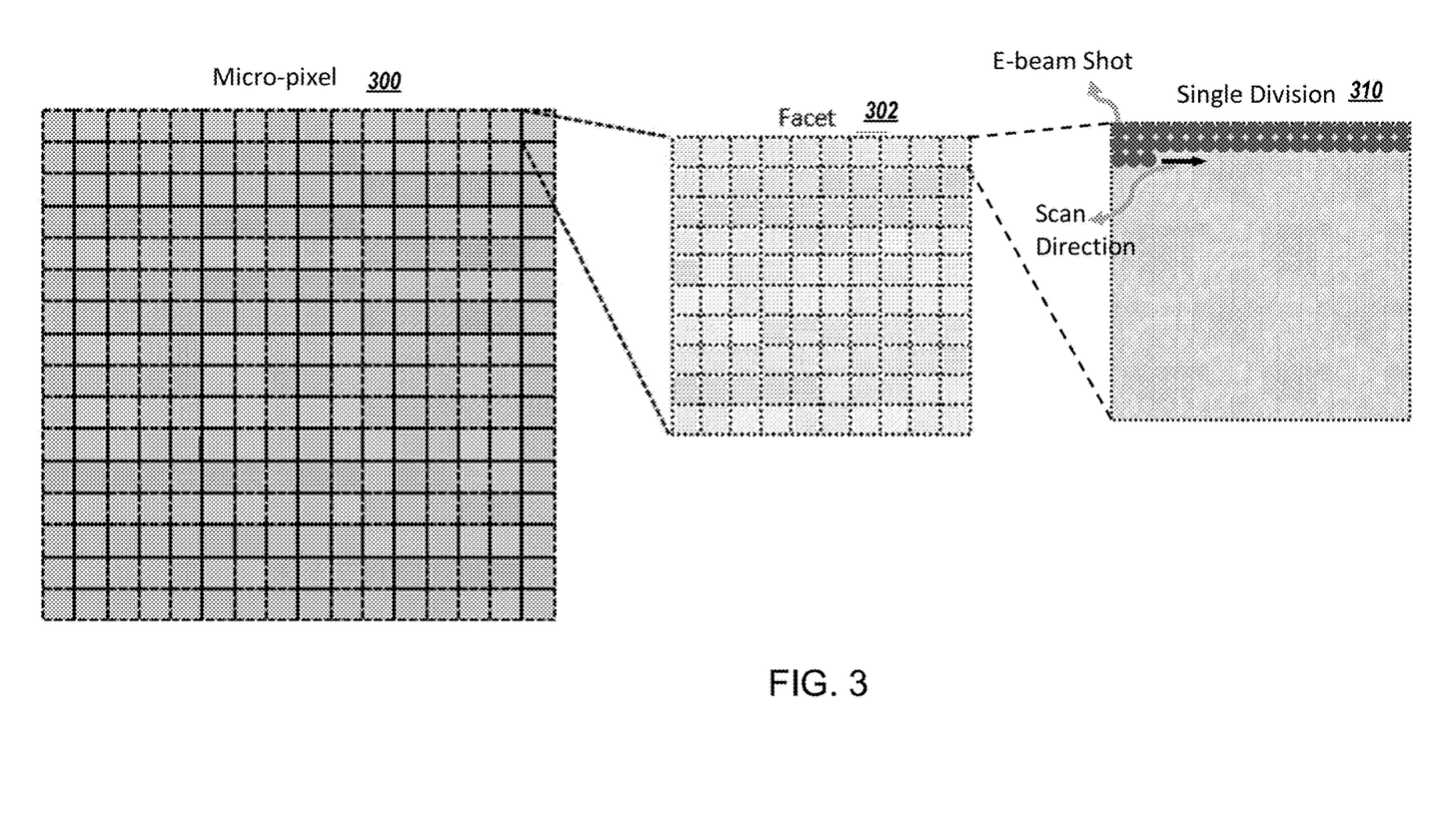
FIG. 3 is a schematic representation of the lithographic patterning of the divisions, facets, and microstructures in accordance with the disclosure.

The division of a microstructure 300 into facets 302, and the facets 302 into divisions 310 is shown in FIG. 3. The microstructure 300, facets 302, and divisions 310 can correspond to the microstructures, facets, and divisions described herein, including the structures of the patterned resist 110. The microstructure 300 is shown in a top-down view and the facets are denoted by the dashed lines dividing the microstructure 300 into a number of squares. A single facet 302 is shown in an expanded top-down view and is divided into single divisions by dashed lines. A single division 310 is shown in an expanded top-down view and the EBL beam scanning pattern is shown as a number of grey dots, each dot indicating an EBL beam shot and the scanning direction indicated by a straight arrow. In this manner, following a series of EBL beam shots, the divisions 310 are etched into the resist material and define the facets 302 and microstructure 300.

Figure 4:
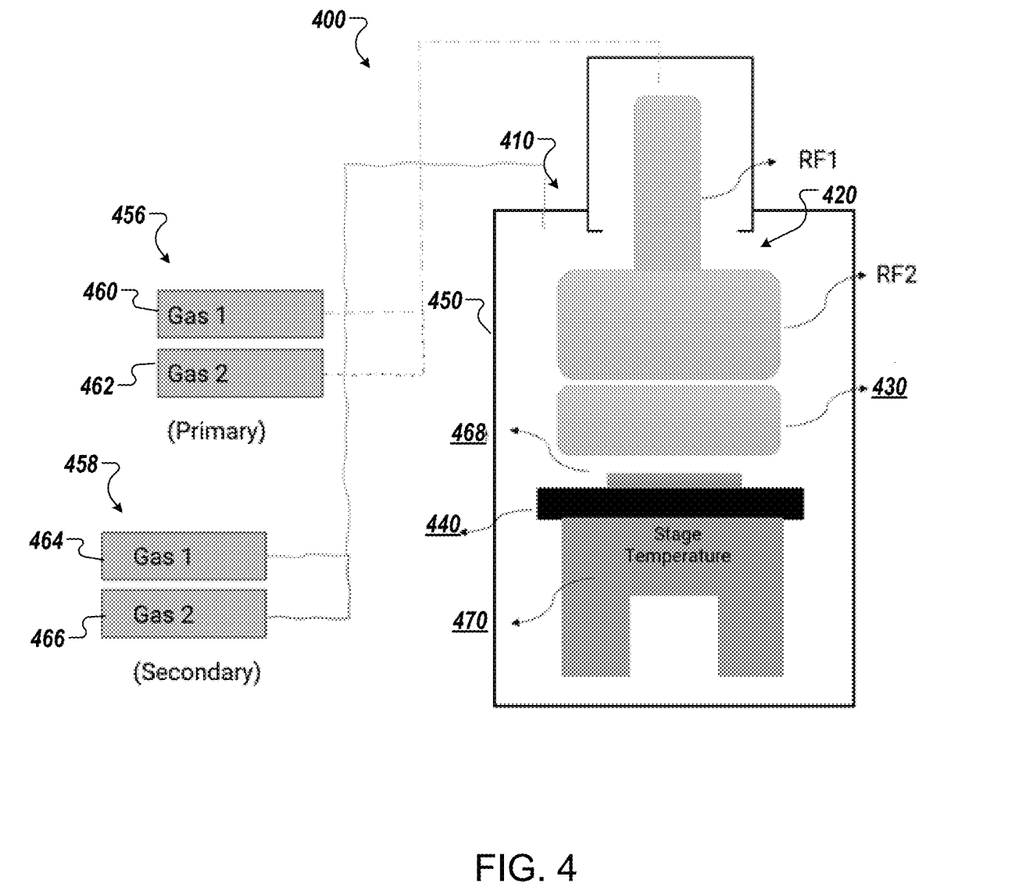
FIG. 4 is a schematic representation of a reactive ion etch system in accordance with the disclosure.

An exemplary deep reactive ion etch (DRIE) system 400 including various components is shown in FIG. 4. The DRIE system 400 includes a parallel-plate plasma generation system 410 with an RF plasma generator 420. The RF plasma generator 420 is separated into two components RF1 and RF2 which are in electrical connection with a top and bottom electrode, e.g., platen 430 and stage 440. The DRIE system 400 controls the bias voltage between the top and bottom electrodes inside of a plasma processing chamber 450 which generates a plasma between the platen 430 and the stage 440.

The DRIE system 400 includes a cooling system 470, e.g., but not limited to, a helium cooling system, in connection with the stage 440 which controls the temperature of the stage 440. The cooling system 470 facilitates increased control over the rate and uniformity of etching of the patterned resist and sample 468 during the dry etch process.

In some nonlimiting examples, the DRIE system 400 is configured to use a one or more gases from one or more gas sources. For example, the DRIE system 400 includes primary gas sources 456, including gas source 460 and 462, and secondary gas sources 458, including gas source 464 and 466. The primary gas sources 456 and secondary gas sources 458 are fluidically connected to the processing chamber 450. The sample 468, which can provide substrate 100, is positioned at the center of the stage 440 during the etching process. The primary and/or secondary gases from are supplied and stabilized before an etch process.

The primary and secondary gases are supplied to the processing chamber 450 concurrently in a non-switching etching process during which the etching gases react with the patterned resist and exposed sample 468 simultaneously. The primary and secondary gases, e.g., but not limited to, the etching gases, are selected based on the reactivity of the etching gases with the patterned resist, such as patterned resist 110, and the sample 468. In a non-limiting example in which ZEP520A is used to form the patterned resist on a silicon sample 468, $SF_6$ and $C_4F_8$ are used to etch the patterned resist into the sample 468.

One or more etch parameters such as gas flow rate, chamber pressure, platen 430 power, and stage 440 temperature in the DRIE system 400 are modulated to achieve one or more process outcomes, such as a selectivity threshold, or an etch anisotropy threshold. The etch selectivity, defined as the ratio between the resist etch rate and the substrate etch rate, determines the depth of the microstructures transferred into the sample 468. A depth in a range of about 2 µm to about 10 µm is suitable for optically variable device displays. The etch selectivity threshold to achieve transfer of the patterned resist into the sample 468 to a suitable depth is greater than about 1 (e.g., but not limited to, greater than about 5, greater than about 10, greater than about 15, greater than about 20, or greater than about 24).

Without wishing to be bound by theory, etch anisotropy, which refers to the differential removal of material in specific directions, is calculated by A=1−V/H, where H is the etch depth and V is the undercut of the etched profile. The anisotropy and undercut measured on an etched structure are indicative of how accurately the microstructures of the patterned resist are transferred into the sample 468. An anisotropy equal to 1 represents an etched feature having an exact vertical 90° wall without any undercut.

The etch process is continued until the patterned resist is removed and the microstructures of the patterned resist are etched, e.g., transferred, into the sample 468 to form a patterned substrate, such as patterned substrate 114. The microstructures of the patterned substrate have a depth profile which corresponds with the depth profile of the patterned resist according to a scalar factor. For example, the patterned substrate has a maximal dimension, dimension $d_2$, which is equal to about the maximal dimension, $d_1$, of the patterned resist of $d_1$×selectivity. In this manner, selection of the resist layer material, EBL beam parameters, processes primary and secondary gases, and process parameters to achieve chosen selectivity and anisotropy values determines the depth of the patterned substrate.

Highly selective processes typically produce many residues during the ion bombardment and suffer from micro-loading and footing effects which hinder achieving high-aspect-ratio structure with smooth surfaces. In developing the present process, the etch characteristics, including anisotropy, surface roughness, selectivity, and etch angle, are affected by the etch parameters, mask material, and the loading effect.

The present method provides a wide range of the silicon to resist etch selectivity which facilitates increased control of the etched substrate depth profiles. Increasing the control of the depth profile allows for greater specificity and accuracy of faceted microstructures fabricated in the substrate. The present method also enables manufacturing of shaped microstructures at wafer scale, increasing the throughput of devices or displays incorporating the microstructures. In addition, the present method provides a non-switching plasma etch process which reduces manufacturing time of the wafers that includes the microstructures.

The method fabricates microstructures including highly anisotropic etch profiles which enables fabricating of microstructures with low micro-loading and footing facilitating increased control and accuracy of the fabricated microstructures.

The details of one or more examples are set forth in the accompanying drawings and the description below. Other features and advantages will be apparent from the description and drawings, and from the claims.

EXAMPLES

Reference will now be made to specific examples illustrating the disclosure. It is to be understood that the examples are provided to illustrate exemplary examples and that no limitation to the scope of the disclosure is intended thereby.

Example 1

Microstructures on a Silicon Substrate with Greyscale Electron Lithography and Dry Etching While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple examples separately or in any suitable subcombination.

Specimens of four-inch silicon wafers with a single crystalline orientation were prepared for experimentation. The wafers were surface-treated using buffered oxide etchant (BOE) to remove native oxide layers. Thick e-beam resist was employed as a soft mask material for all dry etching experiments. Electron beam resist (e.g., ZEP520A) was spin-coated on the silicon substrates to a thickness of 1.8 μm. The thickness of the electron beam resist was adjusted to determine a contrast curve with a Xylene developer. The electron beam resist contrast curve was measured for an EBL beam energy at 50 kV, an electron beam current of 8 nanoamps (nA), a 16 nm beam step size, a beam size of 60-70 nm, a defocused beam size of about 280 to about 310 nm, a depth of focus in a range from about 10 μm to about 20 μm, and the subsequent development processes were accomplished and reproduced with the same electron beam conditions.

Exposing the surface area of the resist material to the EBL beam formed the microstructures in the resist material. The EBL beam was de-focused to increase the beam size which lead to overlapping exposure of neighboring divisions. The beam size was equivalent to about 10× of the EBL beam step size during EBL beam rastering.

The exposed resist was chemically developed after EBL to remove exposed resist material and uncover the microstructures in the patterned resist material. Roughness formed on the surface of microstructures during EBL was smoothed using thermal reflow. The removal of the surface roughness to reduce amplification of nanoscale roughness transferred to the target substrate. The thermal reflow was temperature-controlled to reduce deformation of the developed patterned microstructures.

Dry etching was used to transfer the electron beam resist pattern onto the underlying silicon substrate. The etching selectivity, defined as the ratio between the etch rate of the resist and etch rate of the substrate, determined the depth of the final microstructures transferred onto the substrate.

The dry etching process was performed using sulfur hexafluoride ($SF_6$) and octafluorocyclobutane ($C_4F_8$) gases of varied flow rates. The gas pressure and RF power of the dry etching process were optimized according to the desired selectivity of greater than one. The etching method was a one-step non-periodic process where the $SF_6$ and $C_4F_8$ gases react concurrently with the patterned resist material and the silicon substrate during the exposure of the patterned resist material. The etching experiments were carried out with a deep reactive ion etcher (DRIE) (e.g., an SPTS Plasmalab etch system, available from SPTS Technologies, Newport, UK).

The DRIE chamber was cleaned by oxygen plasma cleaning to remove residues from preceding trials. The gas flows and process pressure were stabilized before the main etching process started. Strike steps were included to ignite the plasma. In several experiments, the chiller temperature was set at values in a range from about −15° C. to about 80° C. to facilitate etching features with controlled roughness. The process chamber parameters were a chamber pressure of 110 mT, high frequency (HF) power of 70 W, $SF_6$ flow rate of 78 sccm, $C_4F_8$ flow rate of 100 sccm, RF1 power of 1985 W, RF2 power of 580 W, and chiller temperature of 0° C. As the etching mechanism is affected by the mask material selection since some mask materials may act as a catalyst for $SF_6$ to react with fluorine and impact process conditions, a suitable mask material was chosen to facilitate a highly selective (e.g., greater than a selectivity of 1) etching process.

A set of trials was performed by applying oxygen ($O_2$) and $SF_6$ gases. The $O_2$ and $SF_6$ gas combination generated extra surface roughness in prolonged processes. Because of the above reasons, $SF_6$ and $C_4F_8$ gas combinations were investigated. The ZEP520A etching rate under $O_2$ and $SF_6$ gases was found to be faster (e.g., lower selectivity) compared to the $SF_6$ and $C_4F_8$ gas combination. To characterize the roughness of the etched surface, atomic force microscopy (AFM) metrology analysis was utilized.

The thickness of the ZEP520A layer was measured by a reflectometer before and after the etching process to determine the etch rate of the resist material. Followed by the etching, the etch height of the silicon was determined by SEM cross-sectional measurements. For the uniformity measurement, the etch depth information was measured at the center of the processed wafer and at different points around the edges.

The selectivity was then determined from the etch rate ratio of the silicon substrate and the electron beam resist material taking into account the micro-loading effect, defined as varying etch rates which depend on the micro-surface dimensions.

To evaluate the anisotropy, the undercut and etch depth were measured based on the SEM cross-sectional view of exemplary etched structures. The anisotropy was calculated by $A=1-V/H$, where H is the etch depth and V is the undercut of the etched profile. An anisotropy value equal to one represents a 90° sidewall without any undercut.

To determine the undercut and anisotropy, trench structures with different dimensions and spacing were patterned using the method described herein, e.g., depositing of resist material, EBL, development, and dry etching (e.g., reactive ion etching). In small trenches of about 200 nm in depth, micro-loading affects the etch rate and feature size. In addition, the lagging effect of reactive ion etching (e.g., the effect of the etching rate being related to the feature size) emerged in deeper trenches and under certain etch process conditions.

Figure 5A:
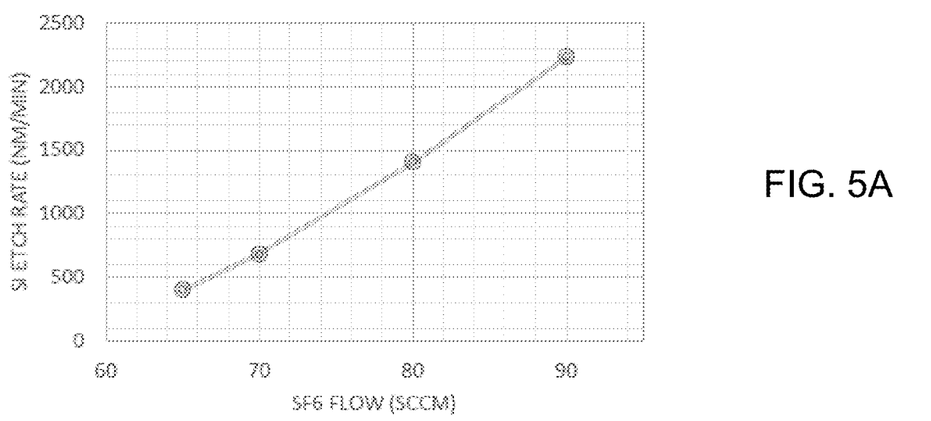
FIG. 5A is a graphic representation showing the effect of the gas flow rate on the etch rate in the non-switching etch recipe in accordance with the disclosure.
Figure 5B:
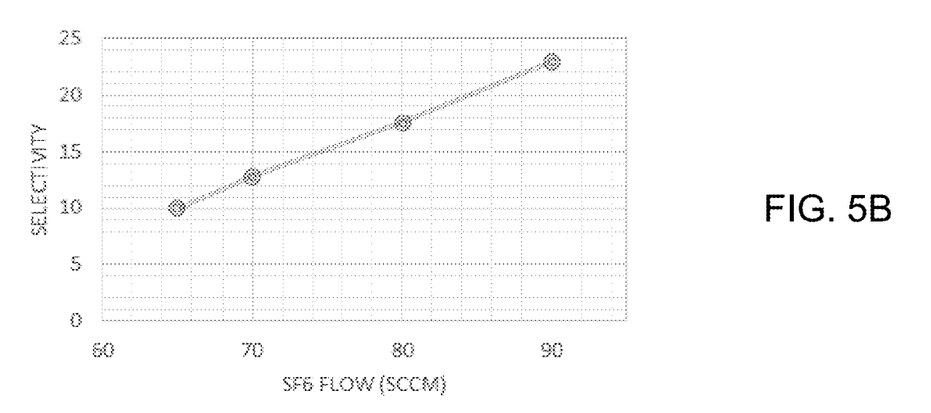
FIG. 5B is a graphic representation showing the effect of the gas flow rate on the selectivity in the non-switching etch recipe in accordance with the disclosure.

The effect of $SF_6$ flow rate on the Si etch rate (nm/minute) and the etch selectivity, are graphically shown in FIGS. 5A and 5B, respectively. Both the silicon etch rate and the selectivity show about a linear dependency on the $SF_6$ flow rate in the flow range where the process pressure, RF power and other parameters are kept unchanged.

As the plasma etching of silicon with fluorinated chemistry is mainly due to free fluorine, the dissociation of $SF_6$ is assumed to involve electron impact dissociation reactions. Free fluorine concentration is increased in plasma mixture in the etch chamber by increasing $SF_6$ gas flow rates which leads to higher silicon etch rates, and selectivity.

The etching parameters are determined from the center of the silicon wafer specimens to avoid inconsistency due to non-uniformity. In a standard switching Bosch etch process, surfaces perpendicular to the ion path are etched faster compared to the ones parallel to the ion path, as the etch rate relates to the way the directional energy of fluorine ions is released onto the etched surface. The anisotropy of the sidewall is changed based on the ratio between $C_4F_8$ and $SF_6$ flow rates. At higher $C_4F_8$ flow rates, the passivation layer become thicker, leading to positively tapered trench profiles. Based on the same logic, sidewalls turn to negatively tapered in opposite trends.

Figure 5C:
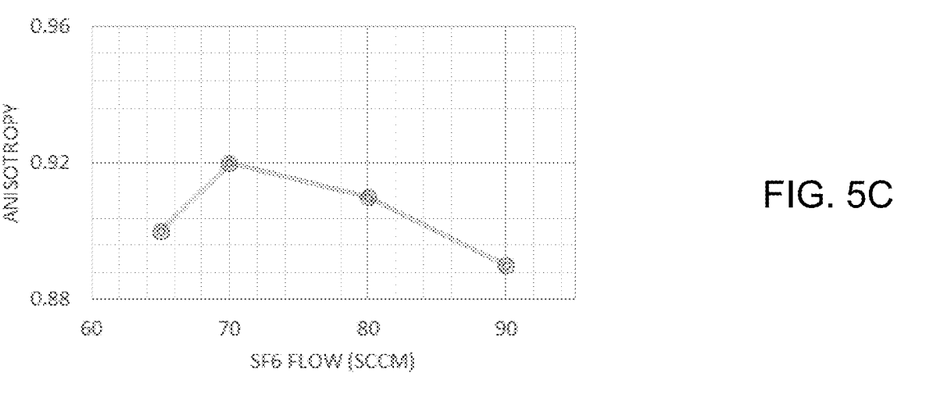
FIG. 5C is a graphic representation showing the effect of the gas flow rate on etch anisotropy in the non-switching etch recipe in accordance with the disclosure.

It was observed that, at higher $C_4F_8$ flows, the etch rate was decreased because of the interactions of passivation compounds with fluorine radicals on the silicon surface. As a result, the ratio of $SF_6$ and $C_4F_8$ mixture is controlled to achieve a desired sidewall profile. Increasing $SF_6$ flow rate leads to a reduction of the tapered angle from a positively tapered profile in the sidewall is shown in FIG. 5C. The tapered angle reaches a maximum anisotropy value (e.g., 0.92, or about vertical) at 70 standard cubic centimeters per minute (sccm) of $SF_6$, and the anisotropy decreases gradually with increasing $SF_6$ flow rate (e.g., at 80 sccm and 90 sccm). The decreasing anisotropy indicates that the sidewall profile becomes negatively tapered with enhanced undercut due to higher amount of fluorine concentration.

Figure 6A:
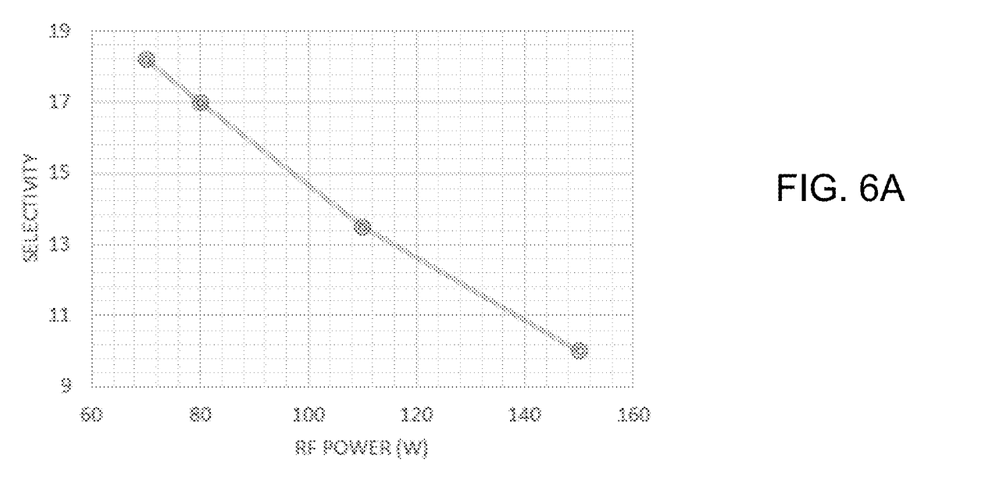
FIG. 6A is a graphic representation showing the effect of RF power on selectivity in the non-switching etch recipe in accordance with the disclosure.
Figure 6B:
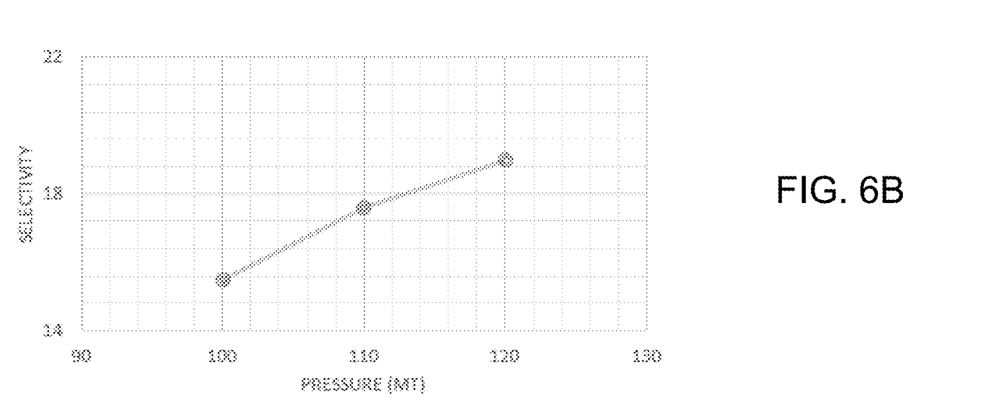
FIG. 6B is a graphic representation showing the effect of chamber pressure on selectivity in the non-switching etch recipe in accordance with the disclosure.
Figure 6C:
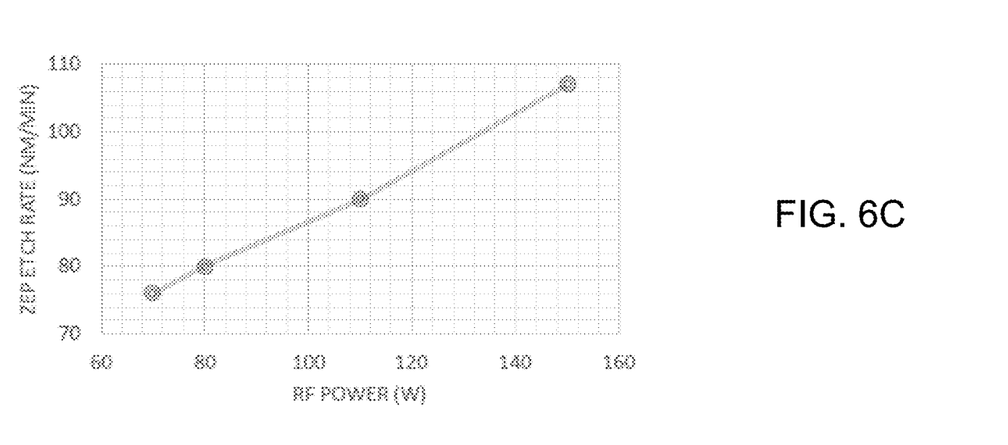
FIG. 6C is a graphic representation showing the effect of RF power on etch rate in the non-switching etch recipe in accordance with the disclosure.

Increasing the RF power of the etch process increases the atomic fluorine concentration which increases the ZEP520A etch rate and reduces the selectivity. The effect of selectivity with RF power and chamber pressure, respectively, in the etch recipe are graphically shown in FIGS. 6A and 6B. In the fluorine chemistry described herein, the selectivity was found to increase linearly with increasing chamber pressure and decrease linearly with increasing RF power. The bias voltage increased with increasing RF powers. The effect of RF power on resist etch rate (nm/minute) is shown graphically in FIG. 6C. At high RF power, the physical ion bombardment contributes to the etch rate more than compared to the chemical interaction, leading to an increased resist etch rate and reduced selectivity.

At low pressures when $SF_6$ and $C_4F_8$ gases interact in the plasma, the directional ion bombardment increases to a certain extent. The fluorine acceleration is increased which leads to the increase of the ion bombardment at the perpendicular surfaces. In addition to the chamber pressure, higher RF power intensifies the physical bombardment as well, which results in an enhancement of anisotropy. By increasing the RF power and decreasing the chamber pressure, the physical etch components dominate significantly and result in a higher anisotropy of the etch profile.

Figure 7A:
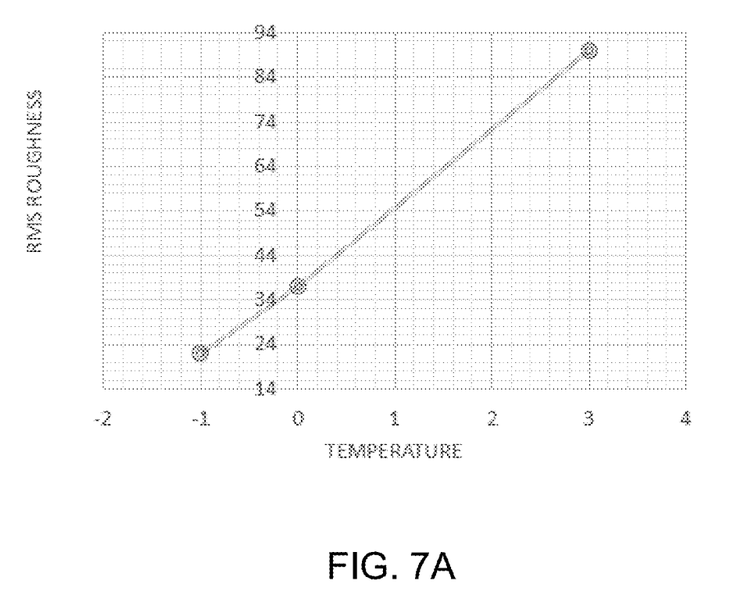
FIG. 7A is a graphic representation showing the effect of chiller temperature on RMS surface roughness in the non-switching etch recipe in accordance with the disclosure.
Figure 7B:
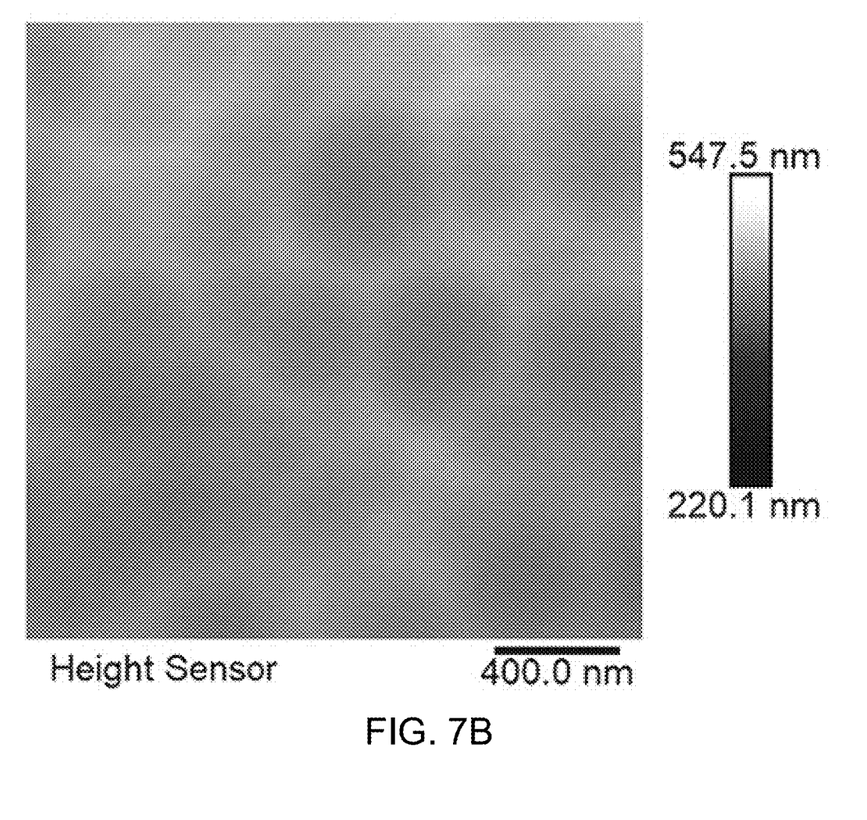
FIG. 7B is representation of an atomic force microscopy image of a surface roughness profile showing the average roughness of an area on a representative sample in accordance with the disclosure.

At the lower chiller temperature (e.g., as low as about $-1°$ C.), the smoothness of the patterned increases compared to higher chiller temperature (e.g., above about $1°$ C.). The RMS surface roughness (nm) dependence on the chillers' temperature is shown graphically in FIG. 7A. The RMS roughness is increased four times from a chiller temperature of about $-1°$ C. to about $3°$ C. The average RMS roughness (e.g., an RMS roughness of about 22 nm) of the bare silicon area on the trench sample at $0°$ C. chiller temperature is shown in the AFM image of FIG. 7B. The etched surface roughness is the result of residual micro-masking that is generated by the passivation layer and existing by-products of the deep etch process. At low temperatures, the micro-masking formation is slowed down leading to a smoother surface. Note that, in the anisotropic plasma chemistry mechanism, the redeposition of residual particles on the surface profile results in micro-mask generation and contamination of the resist film, which lead to the increase of the surface roughness. In addition, due to lower amount of generated passivation layer on surface, the etch area roughness gets improved significantly at a cost of lower selectivity.

The anisotropy of the etch profile is dependent on the process pressure, RF power, $SF_6/C_4F_8$ flow rate ratio, and chiller temperature in this non-switching etch recipe. Furthermore, the anisotropy shows less dependency on RF1 and RF2 power. The sidewall profile varies from positively tapered to negatively tapered depending on the flow rates. It was observed that lower pressures, higher RF power, and optimal $SF_6/C_4F_8$ ratio (e.g., 78 sccm $SF_6$ to 100 sccm $C_4F_8$) generated more directional etching and leads to a more anisotropic etch process. After investigating the above properties, the anisotropic etch recipe was developed which provides a selectivity range of 11 to 24 along with acceptable surface roughness and minimal undercut.

Figure 8A:
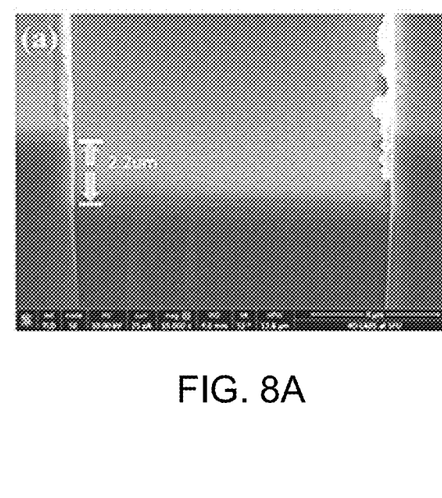
FIG. 8A is representation of a cross-sectional scanning electron microscopy image of vertical sidewall profiles obtained by the non-switching etch recipe in accordance with the disclosure.
Figure 8B:
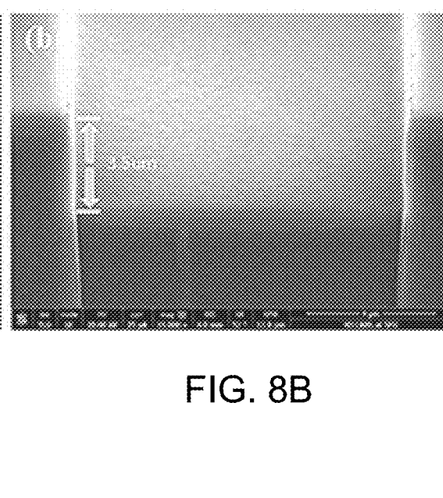
FIG. 8B is a representation of cross-sectional scanning electron microscopy image of vertical sidewall profiles obtained by the non-switching etch recipe in accordance with the disclosure.
Figure 8C:
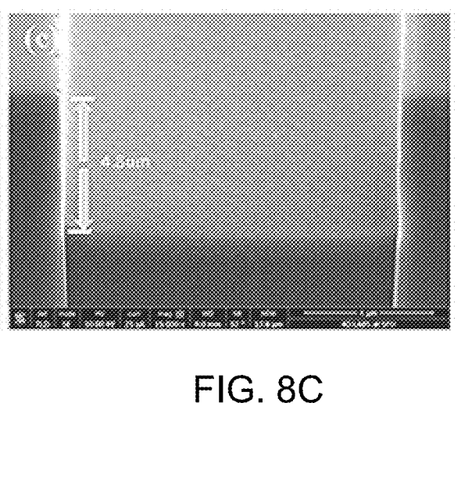
FIG. 8C is a representation of cross-sectional scanning electron microscopy image of vertical sidewall profiles obtained by the non-switching etch recipe in accordance with the disclosure.

Three substrates were etched using the etching method disclosed herein to achieve three selectivity values. Resist material was layered on a substrate and lithographically etched such that the exposed resist material included vertical sidewalls. The patterned resist layer was etched to transfer the depth profile of the resist layer to the substrate. Vertical sidewall profiles obtained by the developed etch recipe at three selectivities in the cross-sectional SEM images of FIG. 8, e.g., (a) selectivity of 11, (b) selectivity of 17.5 (c) selectivity of 24. The etch anisotropy is unchanged and results in vertical sidewalls when changing the selectivity over the range. In some examples, the selectivity is increased by a factor of two (e.g., from 11 to 24) when $SF_6$ gas flow, process chamber pressure, and platen power were increased by 3.2 sccm, 0.5 millitorr (mT), and 9.4 watts (W), respectively, and the chiller temperature was decreased by $0.5°$ C.

Figure 9A:
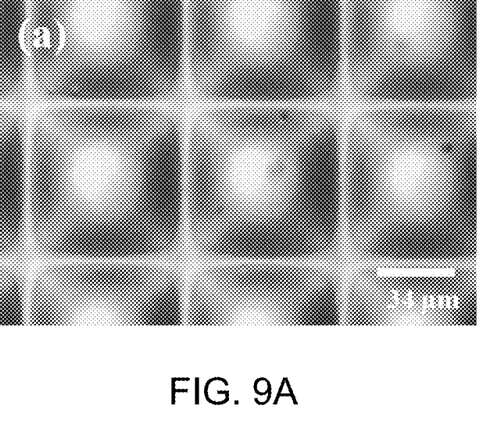
FIG. 9A is a representation of an optical microscopy image of microstructures etched with the non-switching etch recipe in accordance with the disclosure.
Figure 9B:
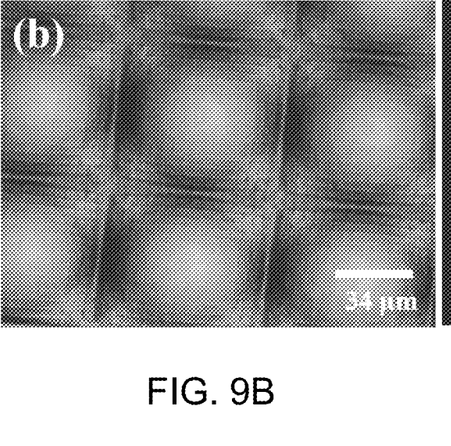
FIG. 9B is a representation of an optical microscopy image of microstructures etched with the non-switching etch recipe in accordance with the disclosure.
Figure 9C:
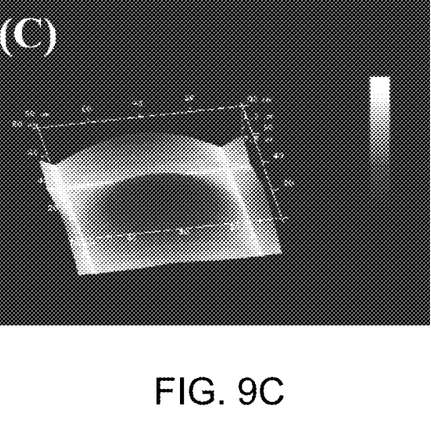
FIG. 9C is a representation of an optical microscopy image of microstructures etched with the non-switching etch recipe in accordance with the disclosure.

Microstructures including arrays of micro-domes were patterned onto substrates using dry etching. Micro-dome arrays with no facet structures and etched using a reactive ion etching system which includes etch isotropy are shown is shown in the optical microscopy image of FIG. 9A. Multi-faceted micro-dome structures fabricated using the non-switching process described herein on a silicon substrate and having an etch selectivity of 17.5 are shown in the optical microscopy image of FIG. 9B. The micro-dome structures including the facets on the surfaces of the micro-domes is shown in the AFM image of FIG. 9C. The non-switching process allows the manufacture of arrays of microstructures including features with an anisotropy of higher than 0.92, a range of selectivity from 11 to 24, and smooth surfaces (e.g., less than 100 nm RMS roughness) following etching.

Figure 10A:
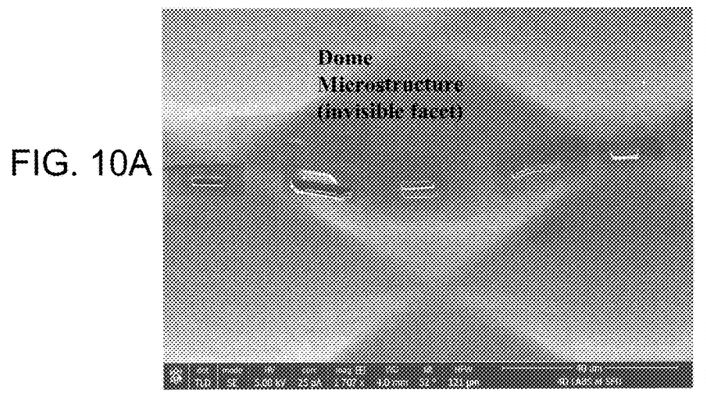
FIG. 10A is a representation of a scanning electron microscopy image of micro-dome arrays fabricated using a reactive ion etching process in accordance with the disclosure.
Figure 10B:
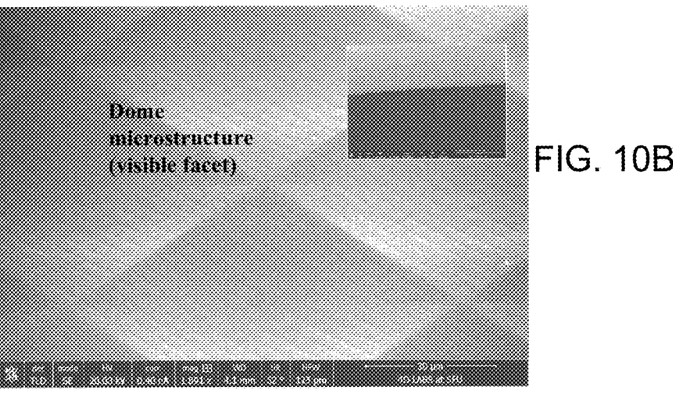
FIG. 10B is a representation of a scanning electron microscopy image multi-faceted micro-dome structures etched with the non-switching etch recipe in accordance with the disclosure.

An SEM image of example micro-dome arrays etched with a selectivity of about 5 with no well-defined facet structures is shown in FIG. 10A. These structures were fabricated using a reactive ion etching system and a process including etch isotropy. An SEM image of multi-faceted micro-dome structures made by with the etch selectivity of 10 and the developed recipe is shown in FIG. 10B. The inset images show the FIB cut on the micro-dome structure. The image shows the schematic of a micro-dome structure with a multi-facet area where each micro-dome size is about 64 µm by 64 µm, and the size of each facet is about 4 µm by 4 µm, and the height is about 5 µm with surface normal that have polar angles ranging up to about 25° and azimuthal angles encompassing 360°.

Figure 10C:
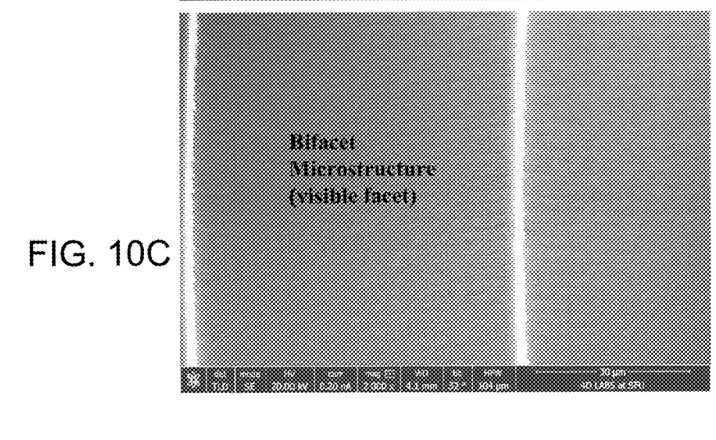
FIG. 10C is a representation of a scanning electron microscopy image micro-bifacet structures in accordance with the disclosure.

Another SEM image of example micro-bifacet (i.e., two faceted) structures showing the facets of micro-bifacet is shown in FIG. 10C. The inset shows a low magnification image of bifacet structure.

Figure 10D:
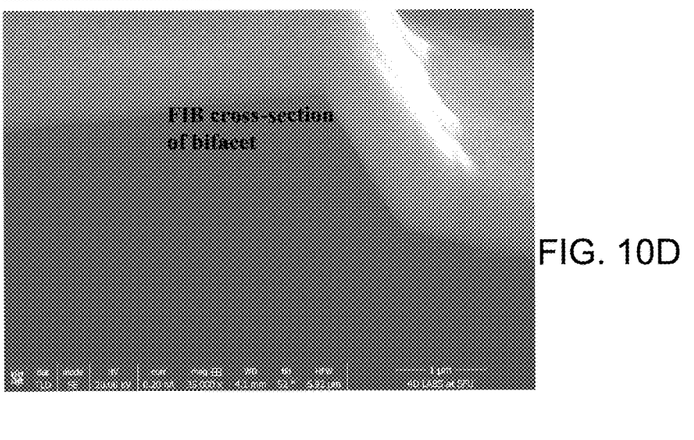
FIG. 10D is a representation of a scanning electron microscopy image of a focused ion beam cross-section of the bifacets of FIG. 10C in accordance with the disclosure.

A focused ion beam (FIB)-cut cross-sectional SEM image is shown in FIG. 10D which demonstrates the bifacet shown in FIG. 10C as fabricated by the described anisotropic etching process on the grayscale lithographic patterns on silicon.

In one example, the patterned substrate is a silicon substrate. This silicon substrate is used to transfer the pattern of microscale structures to a sheet of thermoplastic material. The resulting patterned thermoplastic material may, for example, constitute an optical security structure.

It is to be understood that the above description is intended to be illustrative, and not restrictive. Many other implementations will be apparent to those of skill in the art upon reading and understanding the above description. Although the present disclosure has been described with reference to specific example implementations, it will be recognized that the disclosure is not limited to the implementations described but can be practiced with modification and alteration within the scope of the appended claims. Accordingly, the specification and drawings are to be regarded in an illustrative sense rather than a restrictive sense. Although various features of the approach of the present disclosure have been presented separately (e.g., in separate figures), the skilled person will understand that, unless they are presented as mutually exclusive, they may each be combined with any other feature or combination of features of the present disclosure.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple examples separately or in any suitable subcombination. Those skilled in the art will recognize, or be able to ascertain, using no more than routine experimentation, numerous equivalents to the specific examples described specifically herein. Such equivalents are intended to be encompassed in the scope of the following claims.

What is claimed is:

1. A method for patterning a substrate, comprising:
   depositing a layer of resist material on a surface of the substrate, the substrate comprising a substrate material;
   lithographically patterning the layer of the resist material to provide a patterned resist layer having a pattern with a depth profile that varies over an area of the layer of resist material, the lithographic patterning comprising:
   exposing the layer of the resist material to an electron beam while varying an energy of the electron beam over the area in a pattern that corresponds to the depth profile to provide an exposed resist layer; and
   developing the exposed resist layer to selectively remove resist material from the exposed resist layer to form the patterned resist layer;
   etching the patterned resist layer and the substrate by exposing the patterned resist layer and the substrate to a plasma under conditions sufficient to transfer the pattern of the patterned resist layer to the substrate by removing substrate material from the substrate to form a patterned substrate having a depth profile corresponding to the depth profile of the patterned resist layer, thereby providing a patterned substrate; and
   between lithographically patterning and etching, exposing the patterned resist to a thermal reflow process comprising elevating a temperature of the substrate and the patterned resist material above a glass transition temperature of the patterned resist material and below a glass transition temperature of the substrate.

2. The method of claim 1, wherein the depth profile of the patterned substrate has a maximum dimension that is greater than the maximum dimension of the depth profile of the patterned resist layer.

3. The method of claim 1, wherein the maximum dimension of the depth profile of the patterned substrate is in a range from 1 micron to 20 microns, and wherein the pattern comprises a periodic pattern, or a non-periodic pattern.

4. The method of claim 2, wherein the depth profile of the patterned substrate is scaled to the depth profile of the patterned resist layer by a selectivity value, which is greater than 1.

5. The method of claim 1, wherein lithographically patterning the layer of resist material comprises applying grey-scale electron beam lithography, laser direct-write lithography, or greyscale photolithography.

6. The method of claim 5, wherein the lithographically patterning the layer of resist material comprises scanning an electron beam over a plurality of steps, each step having a step size, and the electron beam size having greatest dimension at least 5 times greater than the beam step size during rastering.

7. The method of claim 1, wherein the temperature of the substrate and the patterned resist material is in a range from 120° C. to 140° C.

8. The method of claim 1, wherein a roughness of the patterned resist layer, following the thermal reflow process, is less than an RMS roughness of 100 nanometers.

9. The method of any claim 1, wherein exposing the patterned resist layer and the substrate to a plasma comprises:
   providing a first gas and a second gas to a process chamber at a first flow rate and a second flow rate, respectively; and
   applying an RF power in the process chamber to generate the plasma.

10. The method of claim 9, wherein the first gas or the second gas comprise molecular oxygen, sulfur hexafluoride, or octafluorocyclobutane.

11. The method of claim 9, wherein the first flow rate and the second flow rate are in a range from 60 sccm to 90 sccm.

12. The method of claim 1, wherein the exposing the layer of the resist material to an electron beam comprises varying an RF power of the electron beam in a range from 60 Watts to 160 Watts.

13. The method of claim 1, further comprising:
   chilling, during the exposing the patterned resist layer and the substrate to a plasma, the patterned resist layer and the substrate below a temperature threshold.

14. A method for patterning a substrate, comprising:
   depositing a layer of resist material on a surface of the substrate, the substrate comprising a substrate material;

lithographically patterning the layer of the resist material to form a patterned resist layer, wherein the patterned resist layer has a pattern with a depth profile that varies over an area of the layer of resist material, the lithographic patterning comprising:
exposing the layer of the resist material to an electron beam while varying an energy of the electron beam over the area in a pattern that corresponds to the depth profile to form an exposed resist layer; and
selectively removing the exposed resist layer to form the patterned resist layer, wherein the patterned resist layer comprises a plurality of resist microstructures, wherein each resist microstructure comprises a plurality of resist facets, wherein each resist facet has a slope, and wherein the energy of the electron beam is varied in the exposing step so that the resist facets have predetermined different slopes, and
using the patterned resist layer in an etching step to transfer the pattern of the patterned resist layer to the substrate, wherein the etching step involves exposing the patterned resist layer and the substrate to a plasma to form a pattern in the substrate, wherein the pattern in the substrate has a depth profile corresponding to the depth profile of the patterned resist layer, wherein the pattern in the substrate comprises a plurality of substrate microstructures, wherein each substrate microstructure has a plurality of substrate facets, wherein there is a one-to-one relationship between resist microstructures of the patterned resist layer and substrate microstructures of the substrate, wherein at least one of the substrate microstructures is less than 250 square microns in area and comprises at least 50 substrate facets.

15. The method of claim 14, further comprising:
transferring the pattern in the substrate to a layer of a thermoplastic material thereby forming an optical security structure.

16. The method of claim 4, wherein the selectivity value ranges from about 9-24.

17. A method for patterning a substrate, comprising:
depositing a layer of resist material on a surface of the substrate, the substrate comprising a substrate material;
lithographically patterning the layer of the resist material to provide a patterned resist layer having a pattern with a depth profile that varies over an area of the layer of resist material, the lithographic patterning comprising:
exposing the layer of the resist material to an electron beam while varying an energy of the electron beam over the area in a pattern that corresponds to the depth profile to provide an exposed resist layer; and
selectively removing the exposed resist layer to form the patterned resist layer, wherein the patterned resist layer comprises a plurality of resist microstructures, wherein each resist microstructure comprises a plurality of resist facets, wherein each resist facet has a slope, and wherein the energy of the electron beam is varied in the exposing step so that the resist facets have predetermined slopes; and
using the patterned resist layer in an etching step to transfer the pattern of the patterned resist layer to the substrate, wherein the etching step involves exposing the patterned resist layer and the substrate to a plasma to form a pattern in the substrate, wherein the pattern in the substrate has a depth profile corresponding to the depth profile of the patterned resist layer, wherein the pattern in the substrate comprises a plurality of substrate microstructures, wherein each substrate microstructure has a plurality of substrate facets, wherein there is a one-to-one relationship between resist microstructures of the patterned resist layer and substrate microstructures of the substrate.

18. The method of claim 17, further comprising:
between lithographically patterning and using the patterned resist layer in an etching step, exposing the patterned resist to a thermal reflow process comprising elevating a temperature of the substrate and the patterned resist material above a glass transition temperature of the patterned resist material and below a glass transition temperature of the substrate.

19. The method of claim 17, wherein:
the depth profile of the patterned substrate has a maximum dimension that is greater than the maximum dimension of the depth profile of the patterned resist layer;
the depth profile of the patterned substrate is scaled to the depth profile of the patterned resist layer by a selectivity value; and
the selectivity value is from about 9 to about 24.

20. The method of claim 17, wherein the etching step comprises dry etching using deep reactive ion etching.

* * * * *